US011854590B2

(12) United States Patent
Guo (10) Patent No.: US 11,854,590 B2
(45) Date of Patent: Dec. 26, 2023

(54) REFERENCE GENERATION FOR NARROW-RANGE SENSE AMPLIFIERS

(71) Applicant: Applied Materials, Inc., Santa Clara, CA (US)

(72) Inventor: Frank Tzen-Wen Guo, Danville, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/239,505

(22) Filed: Apr. 23, 2021

(65) Prior Publication Data

US 2022/0343960 A1     Oct. 27, 2022

(51) Int. Cl.
*G11C 11/16*     (2006.01)

(52) U.S. Cl.
CPC ...... *G11C 11/1673* (2013.01); *G11C 11/1675* (2013.01)

(58) Field of Classification Search
CPC .................... G11C 11/1673; G11C 11/1675
USPC ........................................................ 365/158
See application file for complete search history.

(56) References Cited

U.S. PATENT DOCUMENTS

| 6,317,376 | B1 * | 11/2001 | Tran ..................... G11C 11/1673 365/158 |
| 7,239,537 | B2 | 7/2007 | DeBrosse et al. |
| 8,693,273 | B2 | 4/2014 | Yuh et al. |
| 9,251,881 | B2 | 2/2016 | Kim et al. |
| 9,349,428 | B2 | 5/2016 | Antonyan et al. |
| 9,747,965 | B2 | 8/2017 | Jan et al. |
| 2004/0004856 | A1 * | 1/2004 | Sakimura ................ G11C 11/15 365/158 |
| 2009/0175108 | A1 * | 7/2009 | Dittrich .................. H10B 61/22 365/210.1 |
| 2013/0051114 | A1 * | 2/2013 | Kim ......................... G11C 7/08 365/158 |

(Continued)

FOREIGN PATENT DOCUMENTS

KR     10-1582731 B1     1/2016

OTHER PUBLICATIONS

International Search Report and Written Opinion dated Aug. 13, 2020 in International Patent Application No. PCT/US2020/030937, 9 pages.

(Continued)

*Primary Examiner* — Sung Il Cho
(74) *Attorney, Agent, or Firm* — Kilpatrick Townsend & Stockton LLP (57) ABSTRACT

A sense amplifier reference is generated with the same memory cell columns as data cells in order to match signal paths between the data and reference signals. Each row of data memory cells may have a corresponding set of reference cells, which greatly reduces the number of data cells supported by a reference, and in turn reduces the impact of process variations. A memory array may include data columns, a first reference column in the memory array configured to provide a logic 0 reference signal, and a second reference column in the memory array configured to provide a logic 1 reference signal. A circuit is configured to combine at least the logic 0 reference signal and the logic 1 reference signal to generate a reference signal for a sense amplifier to identify the data signal provided from the data columns.

18 Claims, 9 Drawing Sheets

(56) References Cited

U.S. PATENT DOCUMENTS

| | | | |
|---|---|---|---|
| 2013/0064008 A1* | 3/2013 | Kim | G11C 11/1673 |
| | | | 365/158 |
| 2013/0148429 A1 | 6/2013 | Kim et al. | |
| 2013/0293286 A1 | 11/2013 | Li et al. | |
| 2014/0185361 A1* | 7/2014 | Oh | G11C 13/0002 |
| | | | 365/148 |
| 2015/0262622 A1 | 9/2015 | Lizuka et al. | |
| 2015/0287454 A1* | 10/2015 | Yim | G11C 13/0007 |
| | | | 365/148 |
| 2016/0035402 A1* | 2/2016 | Antonyan | G11C 13/0026 |
| | | | 365/158 |
| 2016/0172026 A1 | 6/2016 | Lee | |
| 2017/0301384 A1 | 10/2017 | Andre et al. | |
| 2018/0350419 A1 | 12/2018 | Koike et al. | |
| 2019/0295621 A1 | 9/2019 | Ikegami et al. | |
| 2020/0402549 A1 | 12/2020 | Guo et al. | |
| 2021/0074347 A1 | 3/2021 | Van Ostrand et al. | |
| 2022/0005517 A1* | 1/2022 | Mangyo | G11C 11/161 |

OTHER PUBLICATIONS

Application No. PCT/US2022/023111, International Search Report and Written Opinion, dated Jul. 6, 2022, 9 pages.

* cited by examiner

REFERENCE GENERATION FOR NARROW-RANGE SENSE AMPLIFIERS

CROSS-REFERENCES TO RELATED APPLICATIONS

This application is related to U.S. patent application Ser. No. 17/009,710, filed on Sep. 1, 2020, entitled "Narrow Range Sense Amplifier with Immunity to Noise and Variation," which is incorporated herein by reference.

TECHNICAL FIELD

This disclosure generally relates reference signals and sense amplifiers in a memory array. More specifically, this disclosure relates to reference columns in a memory that generate a reference signal in a sense amplifier.

BACKGROUND

Modern computer memories use sense amplifiers as part of the circuitry used to read data from the memory. The role of the sense amplifier is to sense low-power signals from a bit line that represents a single bit of data (1 or 0) stored in a memory cell. The sense amplifier then amplifies the small voltage swings to logic levels that can be recognized and interpreted properly by digital logic that interfaces with the memory.

For memories with single bitline, a reference signal is normally used for fast and accurate operation of sense amplifiers. The reference signal is provided to the sense amplifier along with data signal retrieved from memory cell. The data signal is compared with the reference signal to determine the logic value of the memory cell data. The reference level should be set between the ON/OFF resistance levels of the memory cell, which represent the logic levels 1 and 0. For memories with a small ON/OFF resistance ratio it is challenging to maintain the reference position between the small ON/OFF resistance levels over process, operating voltage, and temperature (PVT) variations. In some cases, the read margin can be so small that even the resistance and capacitance (RC) loading effects along read path can be significant. Therefore, an accurate reference generation mechanism is vital for sense amplifier performance, especially in the case of narrow range sense amplifiers that are used in memories with small ON/OFF resistance ratios.

SUMMARY

In some embodiments, a memory system may include a memory array with a plurality of data columns that are configured to store data and provide a data signal in response to a read operation; a first reference column in the memory array configured to provide a logic 0 reference signal; and a second reference column in the memory array configured to provide a logic 1 reference signal. The memory system may also include a circuit configured to combine at least the logic 0 reference signal and the logic 1 reference signal to generate a reference signal for a sense amplifier to identify the data signal provided from the plurality of data columns.

In some embodiments, a method of reading data from a memory system may include receiving, by a memory array, a read signal. The method may additionally include generating a data signal from a data column in a plurality of data columns in the memory array, where the data signal may be provided by the data column when selected by the read signal. The method may also include generating a logic 0 reference signal from a first reference column in the memory array. The method may further include generating a logic 1 reference signal from a second reference column in the memory array. The method may additionally include combining at least the logic 0 reference signal and the logic 1 reference signal to generate a reference signal for a sense amplifier to identify the data signal provided from the plurality of data columns.

In any embodiments, any of the following features may be included or implemented in any combination and without limitation. The memory array may include a Magnetic Random Access Memory (MRAM) array. The memory system may also include a column multiplexer configured to select the first reference column and the second reference column. The memory array may also include a first plurality of reference columns in the memory array configured to provide logic 0 reference signals, where the first plurality of reference columns may include the first reference column; and a second plurality of reference columns in the memory array configured to provide logic 1 reference signals, where the second plurality of reference columns may include the second reference column. The circuit may be further configured to combine at least the logic 0 reference signals and the logic 1 reference signals to generate the reference signal by summing the logic 0 reference signals and the logic 1 reference signals and dividing a sum of the logic 0 reference signals and the logic 1 reference signals by a total number of the logic 0 reference signals and the logic 1 reference signals. The memory array may further include one or more programmable reference columns that may be configured to be programmed to provide logic 0 reference signals or logic 1 reference signals. The one or more programmable reference columns may be programmed and used by the circuit to adjust the reference signal up or down to compensate for process variations. The memory array may further include one or more redundant reference columns that may be configured to provide logic 0 reference signals or logic 1 reference signals as backup reference columns for the first reference column and the second reference column. The memory system may further include one or more circuits that may receive the data signal and the reference signal in response to the read operation, and may use the reference signal to determine whether the data signal represents a logic 1 or a logic 0. The one or more circuits may include a first circuit that removes a common signal component from the reference signal and from the data signal. The one or more circuits may include a sense amplifier that determines whether the data signal represents a logic 1 or a logic 0 using the reference signal after a common signal component is removed and the data signal after having the common signal component removed. The read signal may cause the first reference column to output the logic 0 reference signal, and the read signal may cause the second reference column to output the logic 1 reference signal. A resistance and capacitance (RC) pathway of the logic 0 reference signal may be the same as an RC pathway of the data signal, and an RC pathway of the logic 1 reference signal may be the same as the RC pathway of the data signal. The logic 0 reference signal and the logic 1 reference signal may be combined to generate the reference signal without waiting for the logic 0 reference signal and the logic 1 reference signal to stabilize. The method/operations may also include receiving a write signal for a cell in one of the plurality of data columns; refreshing, in response to the write signal, a logic 0 level for a corresponding reference cell in the first reference column; and refreshing, in response to the write signal, a logic 1 level for a corresponding reference cell in the second reference column. The method/operations may also include determining that the first reference column is malfunctioning, and activating a redundant reference column to replace the first reference column.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Described herein are embodiments for a narrow-range sense amplifier with immunity to noise and process variations. Resistive memory cells have very small ratios between the on-resistance and the off-resistance measured by the sense amplifier. Furthermore, process variations can cause reference currents used by the sense amplifier to drift independently of data signals received from the memory array. In the embodiments described herein, reference columns may be placed in the memory array to provide reference signals that track the process, voltage, and/or temperature variations that also occur in the data signals. Both the reference signal and the data signal can be preprocessed before being passed to the sense amplifier to remove a common signal component from the reference signal and the data signal and to increase the ratio between the on-state and off-state resistance. The reference signal can also be centered between signal levels for the on state and the off state.

Traditional random-access memory (RAM) designs such as flash memory, dynamic RAM (DRAM), static RAM (SRAM), etc., have dominated the computer memory market for the last 20 years. However, resistive memory technologies represent an emerging and viable alternative that may perform well in certain applications. Resistive random-access memory (ReRAM or RRAM) represents a type of nonvolatile computer memory that operates by changing a resistance across a material, such as a dielectric solid-state material. A particular type of resistive memory technology known as magnetoresistive random-access memory (MRAM) stores data in magnetic domains affecting the circuit resistance. It has long been thought that MRAM may eventually surpass competing technologies in computer memory. Like SRAM and DRAM, MRAM is symmetrical memory that can both read and write at high speeds. MRAM is also nonvolatile such that content is not lost when power is removed from the memory cell. However, flash RAM, SRAM, DRAM, and other non-magnetic memories still have practical advantages that have prevented MRAM from being widely used in computer memory. The embodiments described herein overcome some of the technical challenges that exist in current MRAM designs.

Figure 1A:
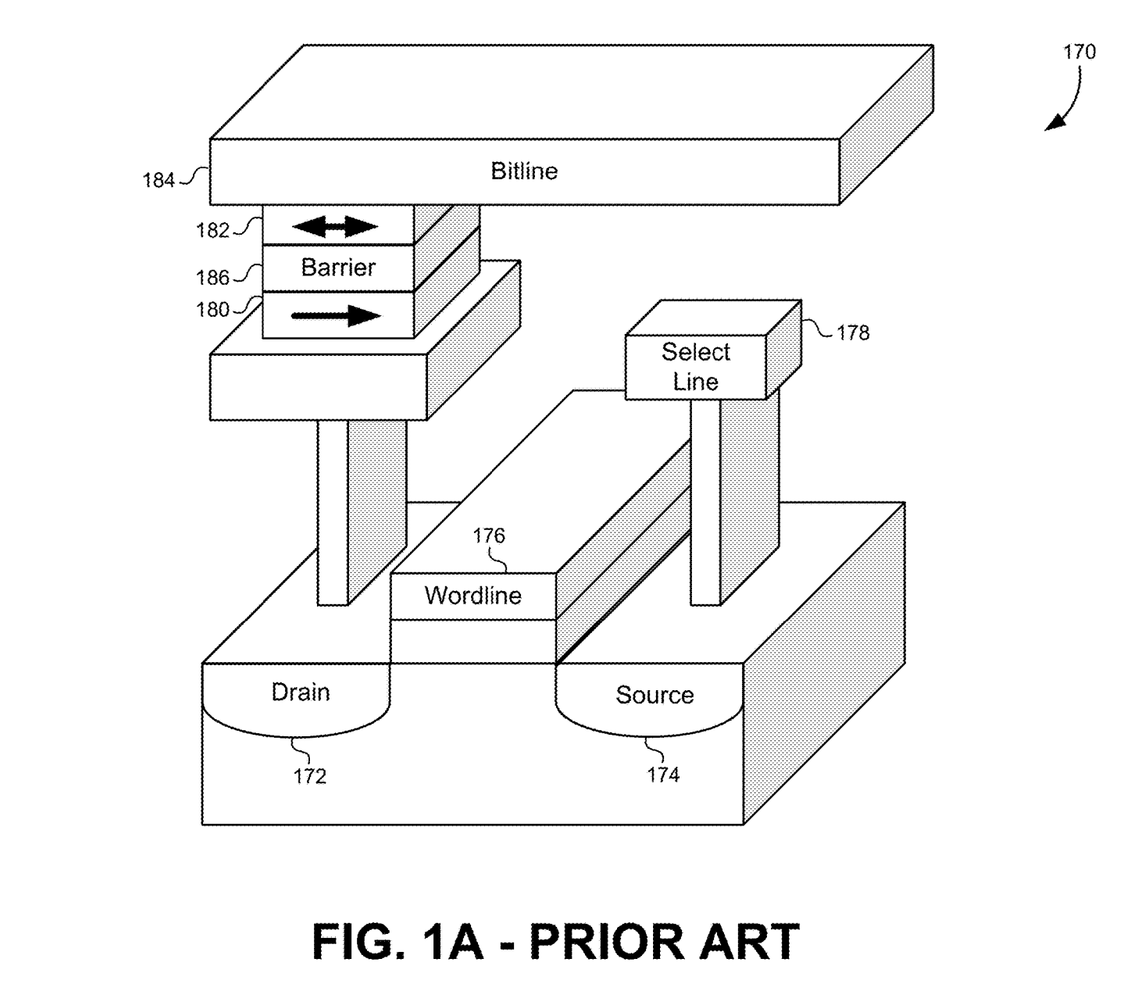
FIG. 1A illustrates a modern design for an MRAM cell, according to some embodiments.

FIG. 1A illustrates a modern design for an MRAM cell 170, according to some embodiments. This design uses a magnetic tunnel junction (MTJ) and a spin-polarized current to flip the spin of the electrons in one of the magnetic layers. A word line 176 runs over the gate of a transistor having a drain 172 and a source 175. The word line 176 can activate this transistor to access the contents of the MRAM cell 170. As described above, the MRAM cell 170 may include a fixed-state magnet 180 and a free-state magnet 182.

To change the memory state of the MRAM cell 170, a polarized current may be applied to flip the spin of the electrons in the free-state magnet 182. Electrons have a spin property describing a small quantity of angular momentum intrinsic to the electron. A polarized electrical current is one where the electrons have a predominant spin orientation in one direction or the other. This polarized current can cause the electrons in the free-state magnet 182 adopt a similar spin orientation. Consequently, this can cause the orientation of the free-state magnet to flip.

The MRAM cell 170 in FIG. 1A includes a barrier oxide layer 186 between the fixed-state magnet 180 and the free-state magnet 182. Tunnel magnetoresistance is a magnetoresistive effect that occurs in an MTJ. The barrier oxide layer 186 may be thin enough that electrons can tunnel between the fixed-state magnet 180 and the free-state magnet 182. Thus, the spin-polarized current may be created and passed through the fixed-state magnet 108. The MTJ allows the angular momentum of the electron spin to be transferred through the MTJ into the free-state magnet 182 and thereby change its electron spins. This process changes the electrical resistance between low-resistance and high-resistance states.

Figure 1B:
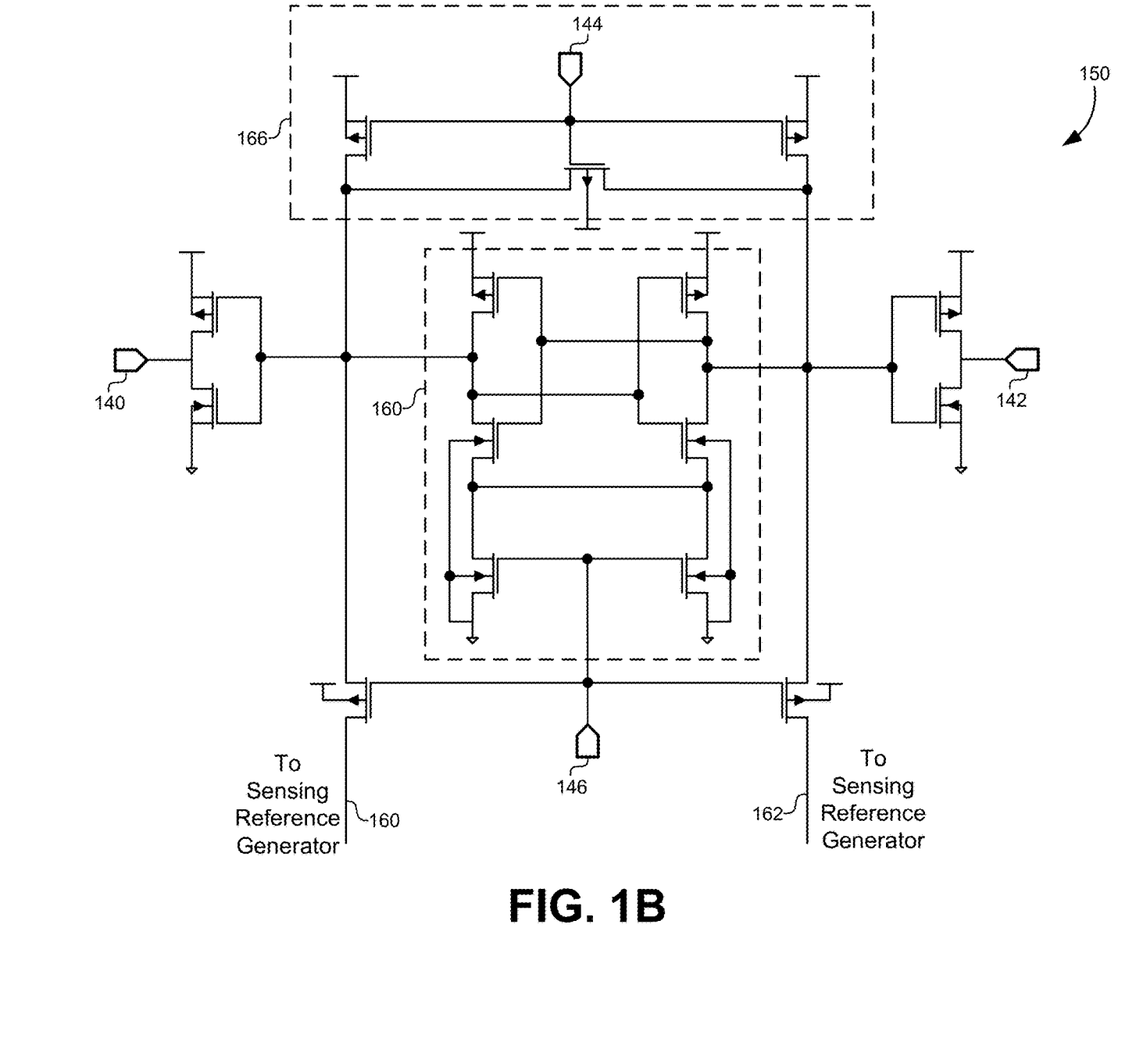
FIG. 1B illustrates a schematic of a sense amplifier, according to some embodiments.

FIG. 1B illustrates a schematic of a sense amplifier 150, according to some embodiments. This sense amplifier 150 includes both a reference current input 160 and a data current input 162. Some embodiments may include an enable input for the sense amplifier at connector 146. The enable input may power up the sense amplifier and/or disconnect the sense amplifier from the reference current input 160 and the data current input 162 to provide a fast sense-amplifier response. The sense amplifier 150 includes six transistors that act as a differential amplifier 164 that detects small differences between the reference current input 160 and the data current input 162. An input 144 can be used to control a sensing equalization circuit 166 comprised of three PMOS transistors that will tend to pull both sides of the sensing circuit to the same potential provided by a connected power supply. This allowed the sense amplifier 150 to act as a latch sense amplifier. Two outputs 140, 142 represent the inverted and non-inverted outputs of the sense amplifier 150 after passing through respective boost inverters.

Reference Signal Generation

Generating a reference signal for a memory sense amplifier is often critical, especially using memory elements with a small ON/OFF resistance ratio. To be effective, the reference signal needs to track the characteristics of the individual memory cells over process, operating voltage, and temperature (PVT) to provide an accurate reference for sensing different levels in the memory element. Cells in the memory array may be chosen to provide a reference such that this tracking over processes, voltage, and temperature is very likely. However, the sensing read margin may be so small that even the resistance and capacitance loading along the traces used in the read path may also need to be matched between the reference cell and the memory cell being read. Further complicating the operation is the fact that memory cells often have a very low retention time, which is sacrifice to maximize the endurance found in SRAM applications.

The embodiments described herein solve these technical problems by providing a reference signal that tracks very closely with the PVT characteristics of the memory element being read. Reference columns may be embedded in the memory array that hold values specifically for calculating a reference signal. These reference columns may be hard-coded with logic 0 and logic 1 values. One or more columns of each type can be selected simultaneously with the read column using the read signal on the word line. The logic 0 reference signals and the logic 1 reference signals can be combined (e.g., averaged) to generate a final reference signal to distinguish between 0 and 1 read data in the memory array. Programmable reference columns may be added to the calculation of the reference signal to compensate for process variations. Furthermore, redundant reference columns may be used as replacements for defective reference columns. The reference columns can be refreshed and/or initialized when data is written to any value in the same row of the memory array. Thus, no special operation is needed to refresh or initialize the reference columns.

MRAM cells are emerging as a viable replacement for SRAM cells in standard memory arrays. The traditional 6T arrangement of transistors used in the standard SRAM cell has a very high endurance. Standard SRAM cells also use a high-resistance and a low-resistance pair of bit lines that do not require a separate reference signal. One of the difficulties in using MRAM cells is replicating the high endurance of SRAM cells. MRAM cells rely on electron tunneling through an oxide. Repeated tunneling stresses the oxide, which reduces the overall endurance of the cell. The embodiments described herein reduce the tunneling stress through the oxide. MRAM cells also only have a single bit line, which requires the use of a separate reference signal for the sense amplifier to differentiate between different memory levels stored in the MRAM cell. The embodiments described herein also overcome the problem of retention in the MRAM reference cell used to generate the reference signal. The short-retention characteristics of an MRAM cell may allow the reference signal to be lost over time unless precautions are taken.

The embodiments described herein can be distinguished from other previous solutions for generating a reference signal in an MRAM memory array. For example, some previous solutions have used a poly resistor that is trimmed to set the reference level for the sense amplifier. However, the PVT tracking from the poly resistor to the MRAM bit cell is generally very poor, which results in a loss of sensing margin. Other solutions have used a mini memory array to set the reference level for all sense amplifiers in the entire memory array. While the PVT tracking with the MRAM cells in the memory array is generally very good, the RC loading along the sensing signal paths (e.g., the bit line and the select line) may be significantly mismatched. This degrades the sensing margin, particularly for memories of very poor I/O signal ratios. Additionally, the entire memory array will generally have a very high density and consequently have a large variation in tail bits. The data 0 and data 1 for these tail bits may cross each other, making the data 0 and the data 1 virtually indistinguishable.

Figure 2A:
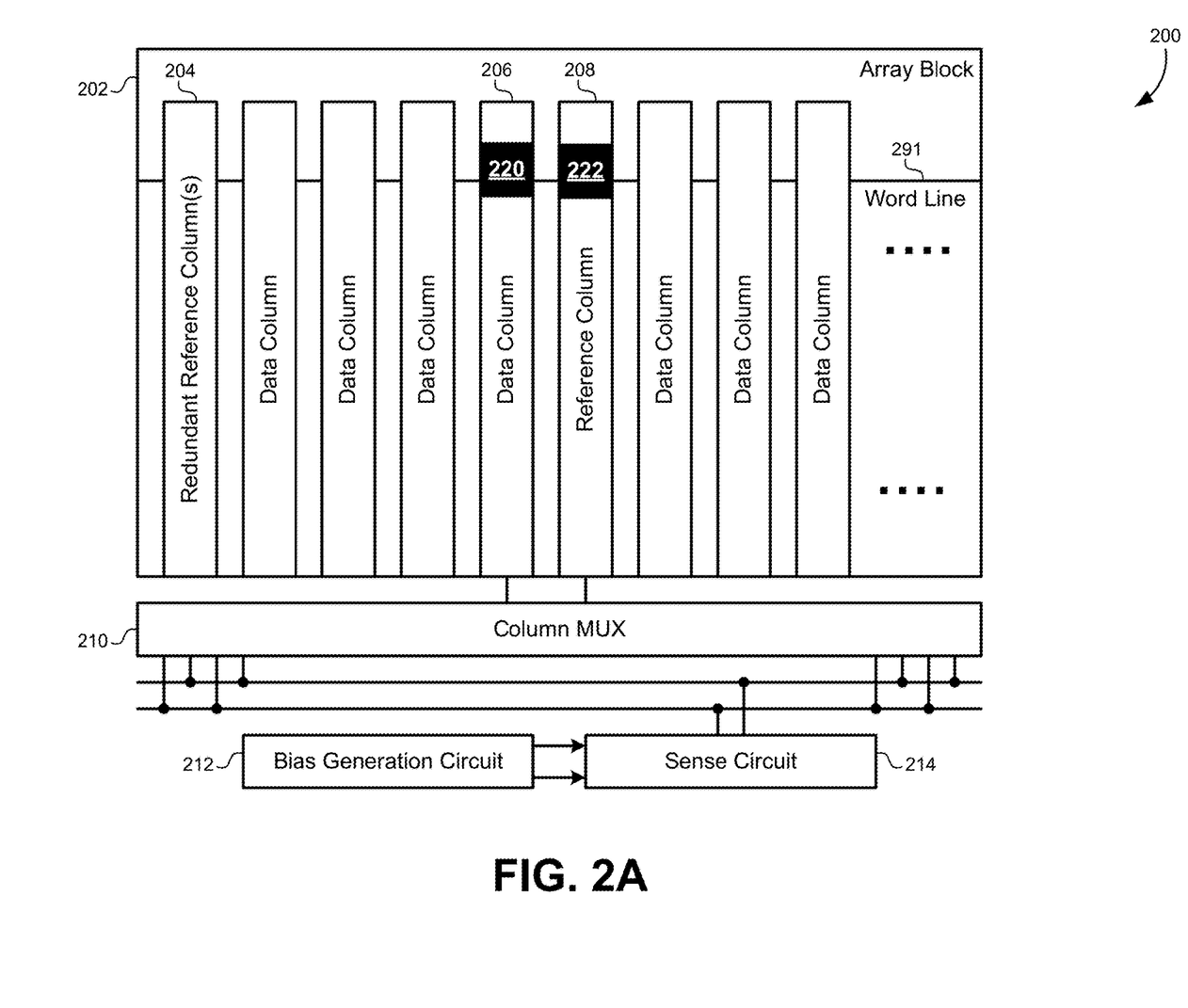
FIG. 2A illustrates a diagram of a memory architecture, according to some embodiments.

FIG. 2A illustrates a diagram of a memory architecture 200, according to some embodiments. The memory architecture 200 may include one or more memory arrays 202. Each memory array 202 may include a plurality of data columns 206, and each of the plurality of data columns 206 may include a plurality of data bits. Data bits in the plurality of data columns 206 can be individually addressed by a word line 291 and a bit line (not shown). As in most traditional memory arrays, the output from the memory array 202 may pass through a column multiplexer 210 before passing into a sense amplifier.

This memory architecture 200 differs from traditional memory architectures in a number of different ways that improve the sensing ability of the sense amplifier. First, a current ratio between logic level 1 (e.g., a high-resistance state) and logic level 0 (e.g., a low-resistance state) may be boosted by filtering out common current components in the data current line and the reference current line. Second, a bias generation circuit 212 and a sense circuit 214 may provide the sense amplifier with immunity to process variations and memory-read disturbances. Third, the memory array 202 may include one or more reference columns that can be used to generate the reference current for the sense amplifier. This allows the reference current to track with process, voltage, and/or temperature (PVT) variations that will be very close to the variations that may be found in the plurality of data columns 206. Each of these features in the memory architecture 200 will be described in greater detail below.

The reference array columns may be placed in the memory array 202 to provide a reference current that is subject to the same process and timing variations as the regular data columns 206. For example, since the reference columns 204 may be manufactured on the same silicon substrate as the data columns 206 and using the same fabrication process, PVT variations caused by the manufacturing process may be substantially the same in both the data columns 206 and the reference columns 208. For example, if PVT variations cause the current from the data columns 206 to be slightly higher than a target value, the corresponding reference current coming from the reference columns 208 will similarly be slightly higher than the target value. If the temperature of the memory array 202 increases/decreases, and thereby affects the internal resistances and/or currents of the data columns 206, the reference current from the reference columns 208 will be affected in the same way since its circuitry is subject to the same temperature variation. By placing the reference columns 208 in the memory array 202, variations in the reference signal from the reference columns 208 can track any variations occurring in the data signal from the data columns 206.

In some embodiments, at least one reference column 208 may be used. The reference column 208 may be placed in an approximate center of the memory array 202. As the size of the memory array block increases, additional reference columns 208 may be added to the memory array block 202. The column multiplexer 210 can select a reference current from one of the reference columns 208 that is physically closest to the data column 206 that is being read. This may be done to minimize difference in the trace lengths that are traversed by the reference signal and the data signal. Some embodiments may divide the memory array 202 into different sectors, and each sector may have its own corresponding reference column 208 in the middle of the data columns 206 of that sector.

Some embodiments may include redundant reference columns 204. The redundant reference columns 204 may be used as backups in case the (primary) reference column 208 fails. Alternatively or additionally, the redundant reference columns 204 may provide additional data points for determining a reference current. For example, reference currents from a plurality of reference columns (e.g., reference columns 208 and redundant reference columns 204) may be averaged or otherwise combined together to generate a reference current for the read operation.

Each of the reference columns 208 may include a plurality of bit cells 222 that are similar to bit cells 220 that are be found in the data columns 206. Some embodiments may allow the bit cells 222 in the reference columns 208 to be programmed with logic 0 or logic 1 values just like the bit cells 220 in the data columns 206.

Figure 2B:
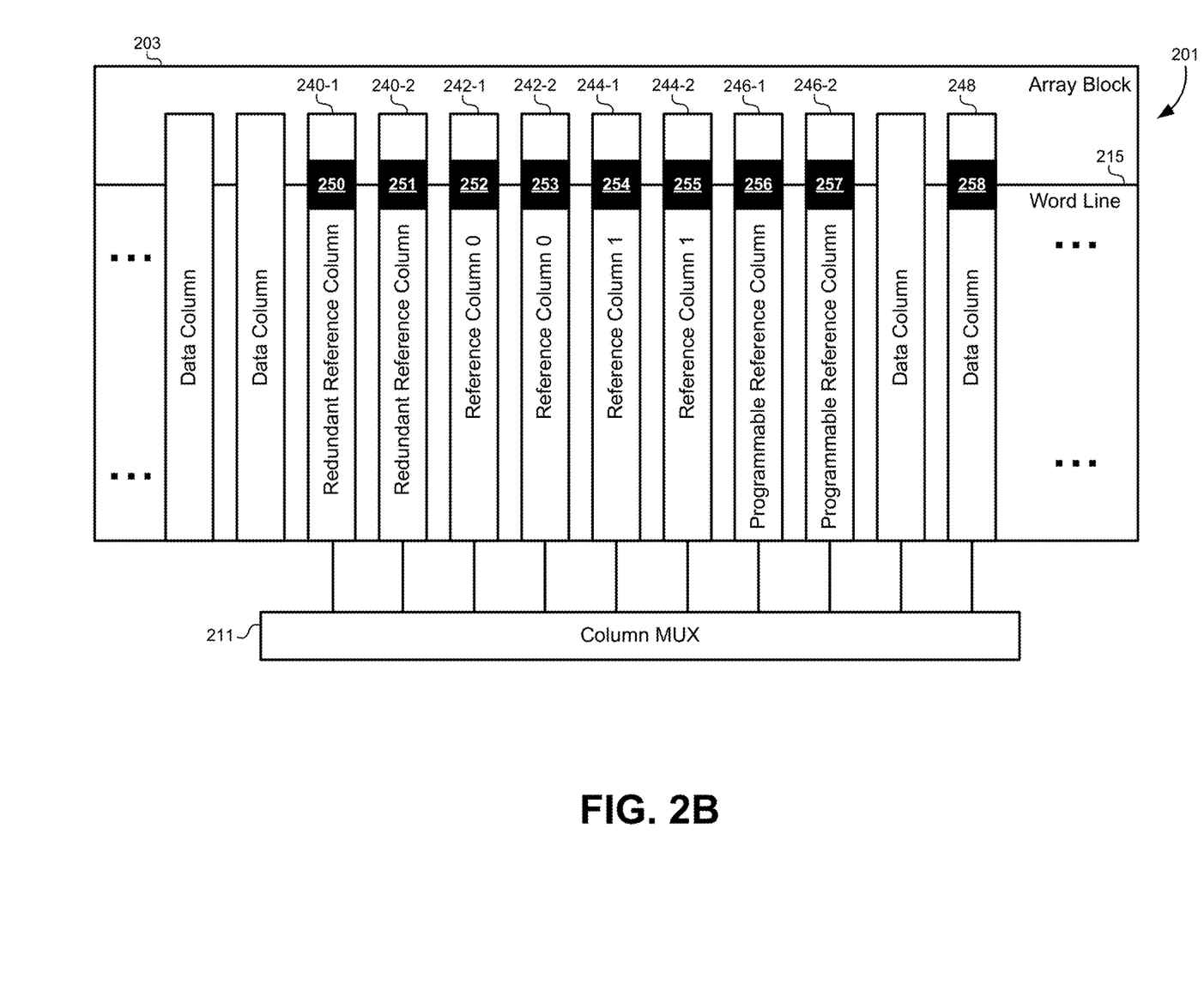
FIG. 2B illustrates a memory architecture with reference columns for both logic 0 references signals and logic 1 reference signals that may be combined to form the overall reference signal for the sense amplifier, according to some embodiments.

FIG. 2B illustrates a memory architecture 201 with reference columns for both logic 0 references signals and logic 1 reference signals that may be combined to form the overall reference signal for the sense amplifier, according to some embodiments. Similar to the memory architecture 200 in FIG. 2A, this memory architecture 201 includes a memory array comprising a plurality of data columns 248. The data columns 248 may be configured to store data and provide a data signal in response to a read operation. The data columns 248 may also be configured to receive data or refresh data in response to a write or refresh operation. A word line 215 may select a memory location or memory cell in each of the data columns 248 in response to a read/write signal or operation. The column MUX 211 may then select the column from which the data should be read/written.

To generate the reference signal, the memory array 203 may include one or more first reference columns that are configured to provide a logic 0 reference signal. The memory array 203 may also include one or more second reference columns configured to provide a logic 1 reference signal. In this example, the memory array 203 includes two first reference columns 242 that are configured to provide the logic 0 reference signal, along with two second reference columns 244 that are configured to provide the logic 1 reference signal. In some embodiments, these reference columns 242, 244 may be hard-coded to always output logic 0 and logic 1, respectively. Thus, some embodiments may not allow a write operation to program the value output by the reference columns 242, 244 to something other than these preprogrammed values.

Note that the use of two reference columns of each type is provided only by way of example in FIG. 2B and is not meant to be limiting. Some embodiments may include only a single first reference column and a single second reference column. Other embodiments may include more than two first reference columns and more than two second reference columns. Generally, a plurality of reference columns of each type may be used to average out any process nonuniformities that may be found in individual columns.

A reference signal may be generated by combining the first reference columns 242 and the second reference columns 244. For example, these columns may output a voltage or current that may be summed or aggregated and then scaled to generate a reference signal that represents an average value between logic 0 and logic 1 stored in the reference columns 242, 244. An example of how these signals may be combined to generate the reference signal for a sense amplifier is described in greater detail below in FIG. 2C.

When a read signal is received, a word line 215 in the memory array 203 may be activated. The word line 215 may select a memory cell 258 in a data column 248 being read by the read operation. The same word line 215 may also select reference cells 252, 253 in the first reference columns 242, as well as reference cells 254, 255 in the second reference columns 244. All of these values may be made available to the column MUX 211. The column MUX 211 may then select the data column 248 to provide the read data to the sense amplifier. Additionally, the column MUX 211 can also select the reference columns that will be used to generate the reference signal for the sense amplifier. In some cases, the column MUX 211 may select the first reference columns 242 and second reference columns 244 to generate a reference signal.

By locating the reference columns 242, 244 in the memory array 203 with the data columns 248, the resistance and capacitance (RC) pathway of the logic 0 reference signals and the logic 1 reference signals may be approximately the same as the RC pathway of the data read from the data column 248. For example, in the reference columns 242, 244 and the data columns 248, the resistance and capacitance experienced through a grounding circuit at the top of the memory array 203, through the traces and memory elements of the reference elements themselves, and the traces through the column MUX 211 will be substantially the same. The length of the traces may be similar enough that the overall RC pathway and characteristics experienced by the reference signals will be approximately the same as the RC pathway characteristics experienced by the read data.

To maintain the similarity in the overall RC pathway, it should be understood that the portion of the memory array 203 illustrated in FIG. 2B represents only a small portion of the overall memory array. Specifically, the overall memory array may include multiple instances of all of the reference columns illustrated in FIG. 2B. These clusters of reference columns may be distributed throughout the memory array and selected as needed by the column MUX 211. When a data column is selected for a read/write operation, the column MUX 211 can select the closest reference columns to the data column being read. This ensures that the overall RC pathway experienced by the logic 0/1 reference signals experience the same resistance and capacitance loads as the read data.

Because the word line 215 selects the reference cells 252, 253, 254, 255 in the reference columns 242, 244 at the same time as the word line 215 selects the data cell 258 in the data column 248, the timing of the propagation of the logic 0 reference signals, the logic 1 reference signals, and the data signals will all be aligned. This provides another advantage over other solutions that simply use memory cells that are not located in reference columns in the same word row of the memory array 203. Specifically, the column MUX 211 and/or the circuitry described below for generating the reference signal does not need to wait for the reference signals or the data signal to stabilize. Any fluctuation on these signals will be similar in all signals because they share the same RC pathway characteristics. Therefore, the read operation does not need a prolonged settling time before the final data can be read.

The resistance values of the memory cells and the reference cells are subject to process variations, which often follow a Gaussian distribution. The larger the memory density, the higher these variations may be. This increases the difficulty of generating a reliable reference signal that is positioned in the middle of the ON and OFF resistance levels for high-density memory arrays. When a word line is activated, the reference cells in the row activated by that word line are enabled to drive reference signals or currents for the data cell in that same row. The reference signals or currents then serve as a reference for the cells in the row activated by the word line. This effectively lowers the density of the memory cells for the associated reference signal, which makes generating the reference signal much easier.

In some embodiments, the memory array 203 may also include one or more programmable reference columns 246. The programmable reference columns 246 may be used to adjust the reference signal up/down. Process variations may cause the logic 0 and logic 1 levels to be statistically distributed with larger standard deviations. This may require the reference signal to be adjusted up/down based on these distributions. Therefore, the programmable reference columns 246 may be programmed by the memory controller to have either the logic 0 or the logic 1 reference signals. The memory controller can then cause the column MUX 211 to add one or more of the programmable reference columns 246 to the circuit that receives all of the logic level reference signals to generate the overall reference signal for the sense amplifier. Note that these programmable reference columns 246 may be programmed dynamically in each specific implementation of the memory architecture 201. For example, after a chip has been manufactured that implements the memory architecture 201, diagnostic testing can be run on the data cells in the memory array 203. If the distribution of signal levels in the data cells exhibits a shift in the midpoint between the two logic levels, the memory controller can program one or more of the programmable reference columns 246 to provide their programmable reference cells 256, 257 to the column MUX 211 for calculation of the reference signal. Any programmable reference columns 246 that are programmed to shift the reference signal may also be selected by the column MUX 211.

In addition to the reference columns 242, 244 and the programmable reference columns 246, some embodiments may also include one or more redundant reference columns 240. The redundant reference columns may be programmable reference columns in some embodiments, while the redundant reference columns 240 may be hard-coded with logic 0 or logic 1 values in other embodiments. The redundant reference columns 240 may be used as backup reference columns for the first reference columns 242 and/or the second reference columns 244. The redundant reference columns 240 may also be used as additional programmable reference columns 246 when they are programmable themselves.

The redundant reference columns 240 may be activated as a backup for a failure detected in other reference columns 242, 244, 246. For example, some embodiments of the memory architecture 201 may perform a diagnostic self-test to identify any data cells or reference cells in the memory array 203 that are malfunctioning. If a nonfunctioning reference cell is identified in one of the reference columns 242, 244, 246, one of the redundant reference columns 240 may be programmed to replace the nonfunctioning reference cell and included in the reference signal calculations by the column MUX 211.

Another technical advantage realized by the memory architecture 201 is the automatic initialization and refresh of the reference cells 250, 251, 252, 253, 254, 255, 256, 257 in the reference columns as a side effect of writing a value to a data cell 258 in the corresponding word line 215. Instead of performing a separate initialization or startup operation that populates the reference columns with the logic 0/1 values, these values can be written to the reference columns when a value is written to the data column 248. For example, when performing a write operation to the data cell 258, the word line 215 will also select the reference cells 250, 251, 252, 253, 254, 255, 256, 257 in the various reference columns. As the right data is written to the data cell 258, the corresponding logic 0/1 values can be written to each of the reference cells individually, as they are already selected by the word line 215. Because no data cells in that word line 215 will be read before at least one of those data cells are written, the memory array 203 can ensure that all of the corresponding reference cells in that word line will be populated when the data cell is read. Similarly, as part of each read/write operation, the data in the reference cells 250, 251, 252, 253, 254, 255, 256, 257 can be refreshed along with the data in the data cell 258. This overcomes the technical problem of providing reference cells that store reference signals in short-retention memories such as MRAM cells.

Figure 2C:
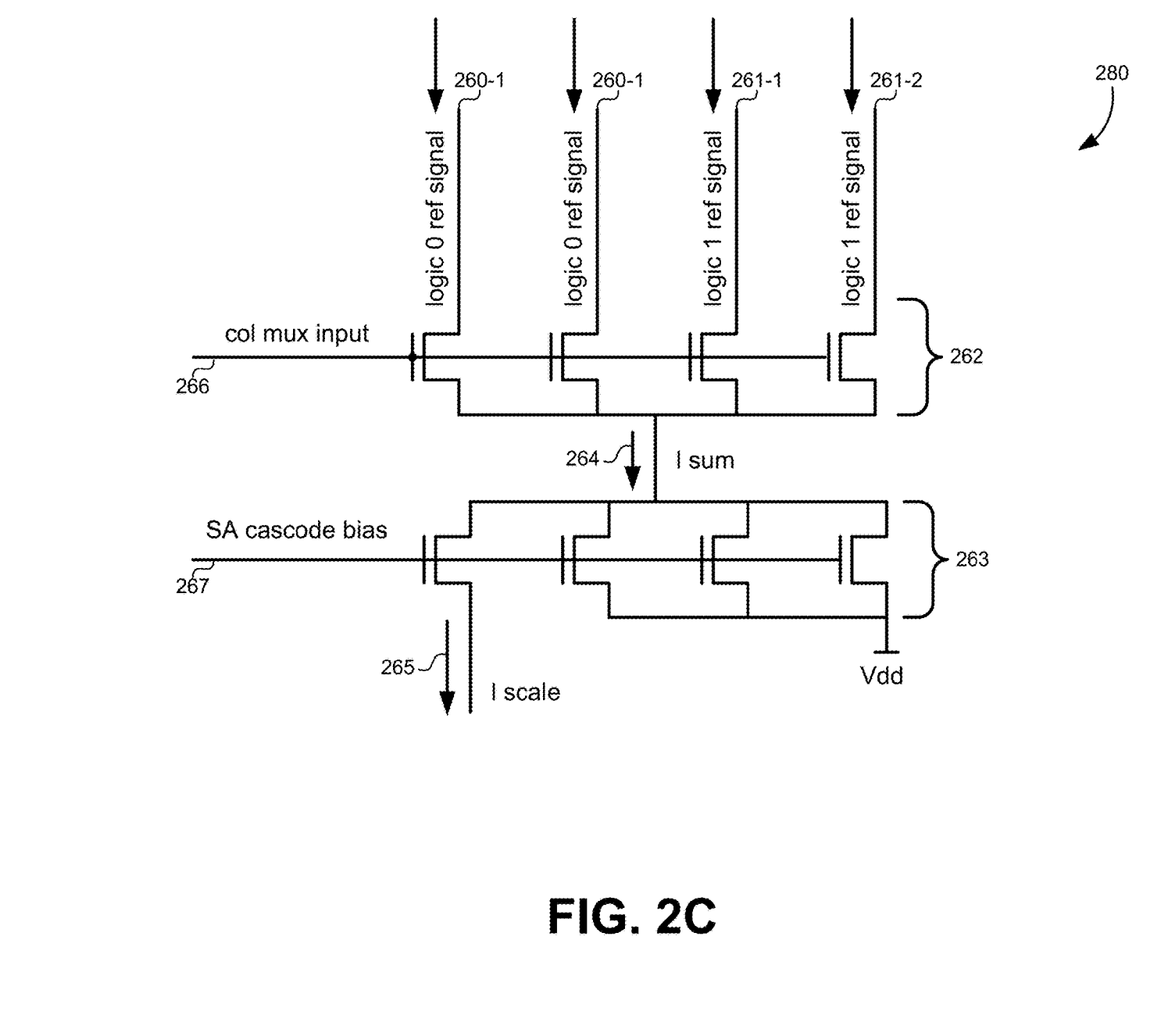
FIG. 2C illustrates a circuit that is configured to combine the logic level reference signals to generate a reference signal for the sense amplifier, according to some embodiments.

FIG. 2C illustrates a circuit 280 that is configured to combine the logic level reference signals to generate a reference signal for the sense amplifier, according to some embodiments. The circuit 280 may include a set of switches 262 that receive the logic 0 reference signals 260 and the logic 1 reference signals 261 from the corresponding reference columns in the memory array. Control signals 266 from the column MUX may activate each of the switches to determine which of the logic level reference signals from the memory array are used to generate the reference signal for the sense amplifier.

Note that this example uses two logic 0 reference signals from the first reference columns and two logic 1 reference signals from the second reference columns in the memory array. However, this number is provided only by way of example and is not meant to be limiting. It will be understood that the circuit 280 may also include additional switches in the set of switches 262 controlled by the control signals 266 from the column MUX that correspond to additional first/second reference columns, redundant reference columns, programmable reference columns, and any other reference columns described above. The control signals 266 from the column MUX may control which of the reference columns are propagated through at any given time. For example, the control signals 266 may activate programmable reference columns to adjust the level of the reference signal. The control signals 266 may also activate redundant reference columns and deactivate other reference columns when malfunctions are detected in the memory array, and so forth.

An aggregate signal 264 may represent a summation of all of the individual signals 260, 261 from the reference columns. For example, some embodiments may sum the current received from each of the reference columns. This aggregate signal 264 can then be scaled using the set of switches 263 connected to Vdd as illustrated in FIG. 2C. This set of switches 263 may be controlled by the cascode bias 267 from the sense amplifier described below, and may act to divide the aggregate signal 264 by the total number of reference columns propagated by the set of switches 262 above. In effect, this operation may scale the aggregate signal 264 back down to an analog level between logic 0 and logic 1 (e.g., an averaging function). The resulting reference signal 265 may then be provided to the sense amplifier for the operations described below.

Sense Amplifier

Figure 3:
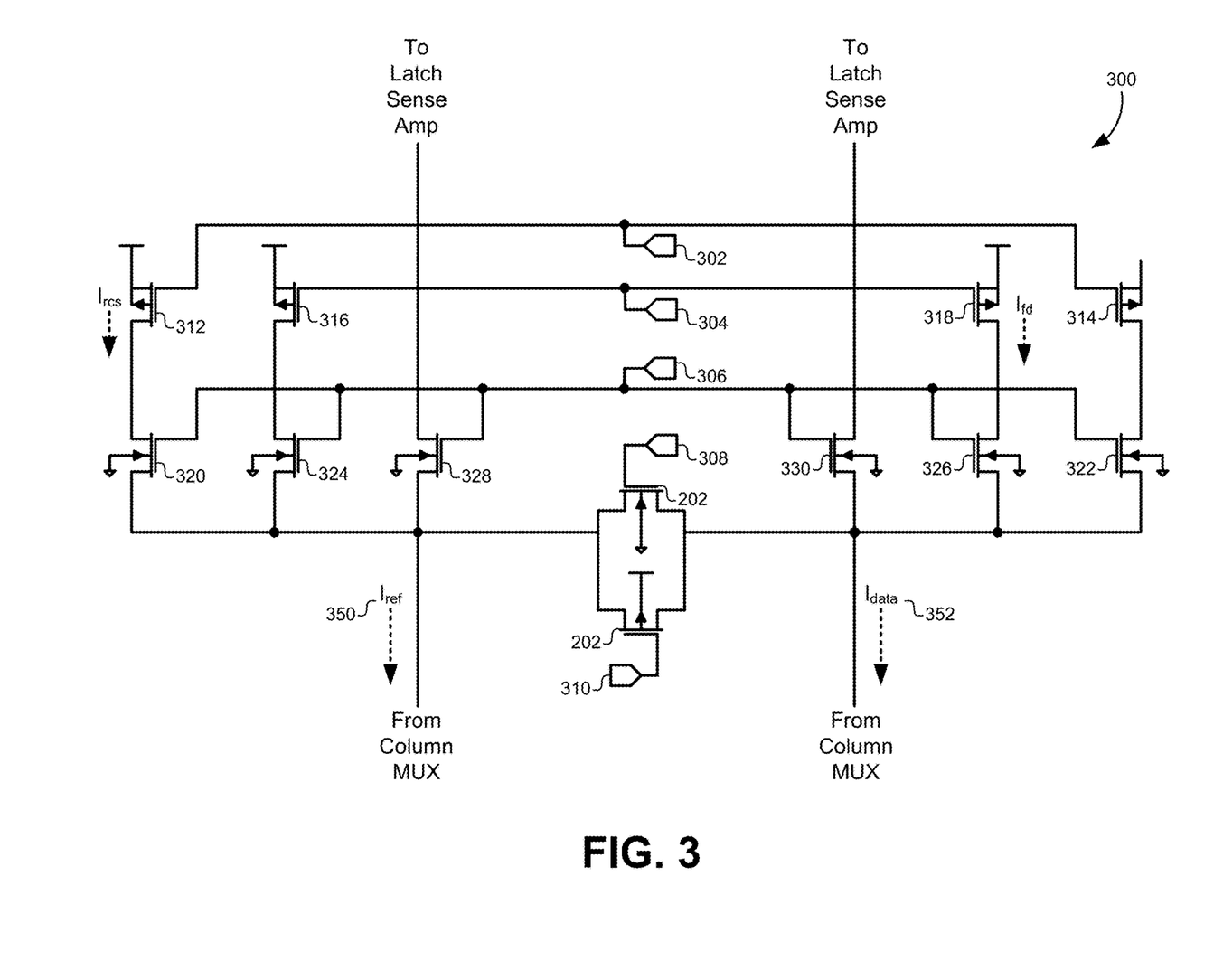
FIG. 3 illustrates a portion of the sense circuit that adjusts a reference current and a data current provided to the sense amplifier, according to some embodiments.

FIG. 3 illustrates a portion of the sense circuit 214 that adjusts a reference signal 350 and a data signal 352 provided to the sense amplifier 150, according to some embodiments. This portion of the sense circuit 214 may be referred to as a reference-generation circuit 300. The reference-generation circuit 300 may be based on three cascoding transistor circuit structures. The first cascoding set of transistors 328, 330 may act as a transistor pair to feed the final data signal 352 and reference signal 350 into the sense amplifier 150.

A second set of cascoding transistors 324, 326 may be used to filter or remove a common signal component from both the reference signal 350 and the data signal 352 coming from the data column and the reference column. The filtering signal may be generated from the regulated current sources provided by two PMOS transistors 316, 318. For example, the current generated through transistor 316 and modified by transistor 324 may generate a filtering current that is injected with the reference signal 350 sent into the sense amplifier 150. Similarly, the current generated through transistor 318 and modified by transistor 326 may generate a filtering current that is injected with the data signal 352 sent to the sense amplifier 150. These transistors can be matched such that the injection current is the same for both the data current 352 and the reference current 350. Transistors 328, 330 may be used for interfacing this filtering current injection into the data signal 352 and reference signal 350 lines to the sense amplifier 150. Because transistors 316, 318 provide a regulated current source, the same current can be injected (i.e., "subtracted") from both the reference signal 350 and the data signal 352.

These transistors 316, 324, 318, 326 and the associated biasing circuits described below may be collectively referred to as a "first circuit" that removes a common signal component from a reference signal and from a data signal. Although this example uses a reference current and a data current, other embodiments are not so limited. Some embodiments may instead measure voltage, resistance, power, inductance, and/or any other electrical characteristic that may be used to represent a logic level. Therefore, the signals may be referred to generically as a "reference signal" and a "data signal," and a "signal" may include currents and any other electrical characteristic that may be measured in a circuit.

A third set of cascoding transistors may include transistors 320, 322. These transistors 320, 322 may be used for adjusting the signal from the reference column by injecting a reference centering signal to generate the final reference signal 350. To create a reference current 350 that can detect both logic 1 and logic 0 levels in the data signal 352, the reference signal 350 provided to the sense amplifier 150 may be adjusted. For example, transistor 320 and transistor 312 may be used to generate the reference-centering signal for the reference signal. The reference signal 350 may need to be large enough to detect logic 0 levels but also small enough to detect logic 1 levels. Ideally, the reference signal 350 may be set to be approximately halfway between the signal of a logic 0 cell and the signal of a logic 1 cell, thus placing the reference signal 350 in the center of these two possible data signal values.

In a manner similar to how the current was injected by transistors 324, 326, the centering signal can be injected and regulated using transistors 320, 322. The injected centering signal, such as a centering current, can be generated by transistors 312, 314 acting as a current source. In some embodiments, the data side of this cascoding circuit need not be supplied with power, and thus no current may need to be injected into the data signal 352 for this centering the reference signal. Only the reference signal 350 may need to be centered between the logic 0 and logic 1 current levels; the data current 352 may not need to be similarly centered. Instead, the transistors 314, 322 may be constructed as dummy transistors for maintaining loading balance in the overall circuit. By injecting a centering signal using transistors 320, 312, the reference signal 350 can be auto-trimmed for each array column. As described above, one of the key technical challenges addressed by these embodiments is to create a tight sensing window that tracks with variations between signals from data columns and reference signals used by the sense amplifiers. This auto-trimming performed by the centering current ensures that the window between logic 0 and logic 1 tracks with PVT variations in the data signal 352. These transistors 312, 320 (and optionally 314, 322) may be referred to as a "second circuit" that adjusts the reference signal to be between a logic 1 signal level and a logic 0 signal level.

For an MRAM memory cell, the tunnel magnetoresistance (TMR) may be described using the following equation.

$$TMR = \frac{R_{ap} - R_p}{R_p}$$

In this equation, $R_{ap}$ represents the logic 1 high resistance for the anti-parallel state of the memory cell, and $R_p$ represents the logic 0 lower resistance for the parallel state of the memory cell. For example, if the TMR is 1.5, then the resistance ratio $$\frac{R_{ap}}{R_p}$$

between the I/O states would be approximately 2.5. Considering process variations that affect these resistance values, along with the additional CMOS circuit variations on the bit line, word line, and column multiplexer, the worst-case resistance ratio may end up being much lower than 2.5. Additionally, the reference current 350 may also shift due to its own PVT variations, which adds to the challenges for MRAM sense amplifiers.

During a read operation, the sense amplifier may receive the current running through the MRAM bit cells as described above after it runs through the bit line, column multiplexer, and sensing circuits. The current detected by the sense amplifier using the reference signal 350 provided above can be characterized by the following equation.

$$\frac{I_p}{I_{ap}} = \frac{I_p - I_{ref}}{I_{ap} - I_{ref}}$$

In this equation, $I_p$ and $I_{ap}$ are currents corresponding to the $R_p$ and $R_{ap}$ resistances, and $I_{ref}$ is the current of the reference signal 350 described above. This equation shows that the closer $I_{ref}$ is to $I_{ap}$, the larger the current ratio.

The effect of the reference-generation circuit 300 illustrated in FIG. 3 is to center the reference current between the logic levels output by the data columns of the memory array such that the reference current 350 tracks the data current 352 as it drifts due to PVT variations. Although these embodiments are described using an MRAM array as an example, other resistive memory technologies may also benefit from using the reference-generation circuit 300 and other circuits described herein. For example, the memory array 202 depicted in FIG. 2 may comprise an MRAM array, a resistive RAM (ReRAM) array, a phase-change RAM (PCRAM) array, and/or any other resistive memory structure. Therefore, the reference-generation circuit 300, the reference columns 208, and the bias generation circuits described below may be used with any type of resistive memory and are not limited to the MRAM memory used herein merely by way of example.

Figure 4:
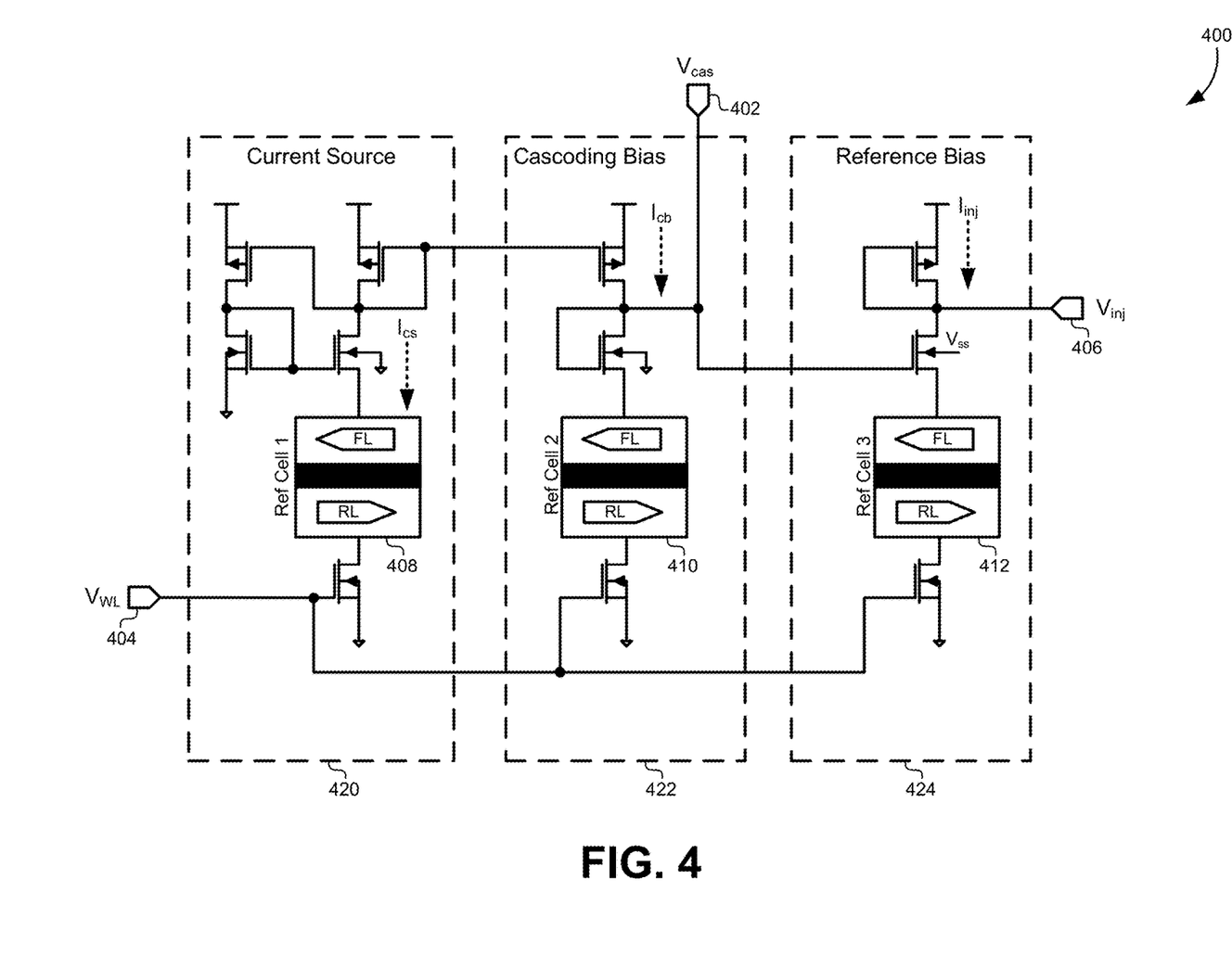
FIG. 4 illustrates a bias-generation circuit, according to some embodiments.

FIG. 4 illustrates a bias-generation circuit 400, according to some embodiments. The bias generation circuit 400 may include three separate sub circuits: a current source circuit 420, a cascoding bias circuit 422, and a reference bias circuit 424. The current source 420 may generate a current based on the resistance of an MRAM bit cell 408. The current source 420 may be referenced by the cascoding bias circuit 422 and the reference by a circuit 424 to generate voltage levels for biasing cascoding circuits ($V_{cas}$ 402) and for regulating the injection currents of the filtering current ($V_{inj}$ 406). These reference levels may be generated based on dummy bit cells 408, 410, 412 in one or more reference columns as described above. This allows these reference voltages to automatically track PVT variations in the data bit cells and their associated pathways to the sense amplifier. The outputs from the bias-generation circuit 400 can be fed directly into the circuit of FIG. 3 to control the removal of the common signal component and the adjustment of the reference current. Specifically, the $V_{cas}$ output 402 may connect to the input 306 in FIG. 3, and the $V_{inj}$ output 406 may connect to the input 304 in FIG. 3.

Figure 5:
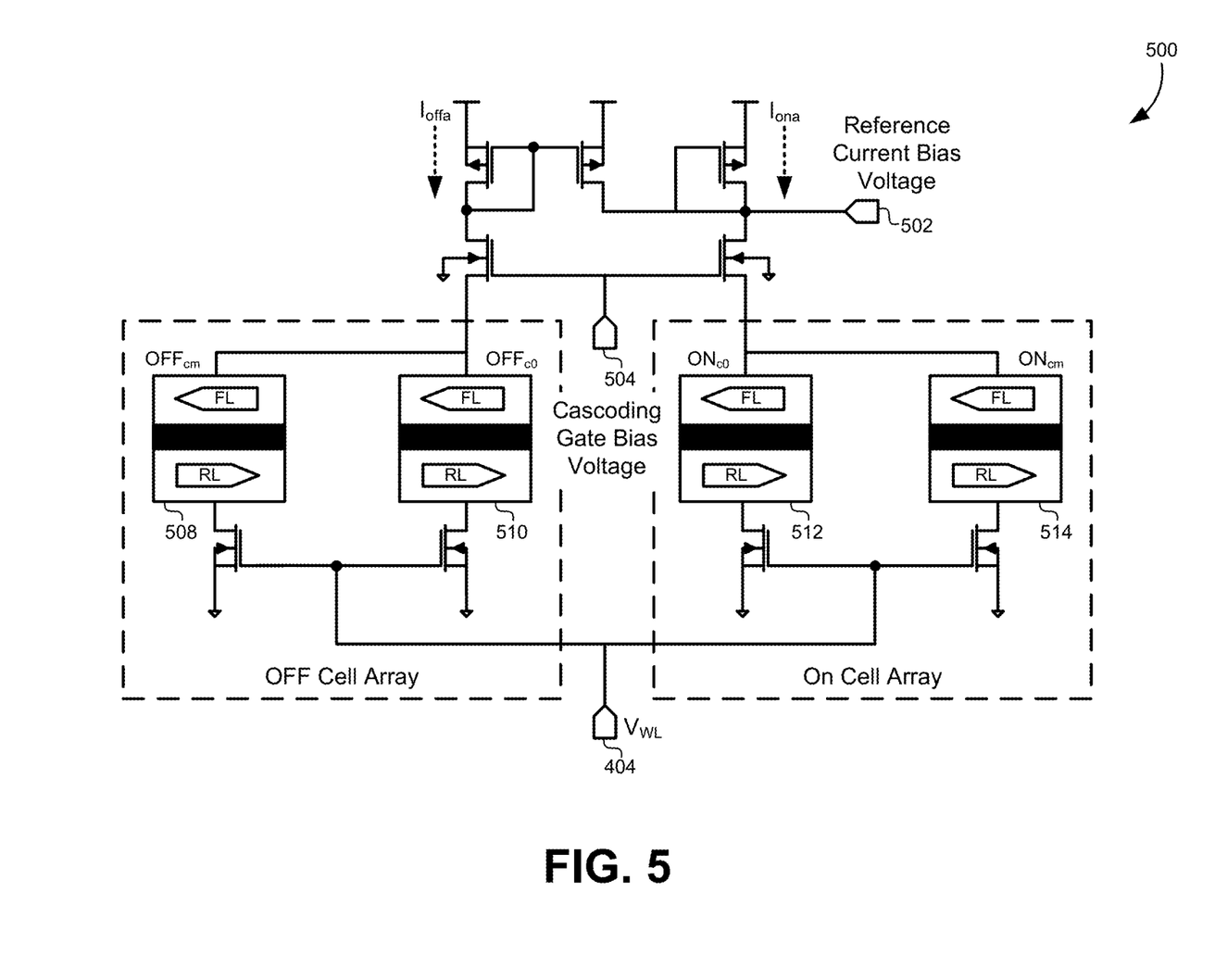
FIG. 5 illustrates circuits for generating additional reference biases used for the centering current, according to some embodiments.

FIG. 5 illustrates circuits 500 for generating additional reference biases used for the centering current, according to some embodiments. The $V_{WL}$ signal connects to the corresponding $V_{WL}$ input 404 in FIG. 4. The $V_{WL}$ signal may be used to turn on and off the reference-biasing circuits in FIG. 4 and FIG. 5 to save power. This enable signal can be generated from the word line signal in the memory circuit described above. These circuits use the difference between a logic 1 array current from bit cells 508, 510 and the logic 0 array current from bit cells 512, 514 to generate the referent current bias 502. The terminals in the circuits 500 of FIG. 5 may be connected to corresponding terminals in the previous figures. For example, output 502 for the reference current bias voltage may be connected to terminal 302 in FIG. 3. Terminal 504 for the cascoding gate bias voltage may be connected to the corresponding output 404 in FIG. 4.

Figure 6:
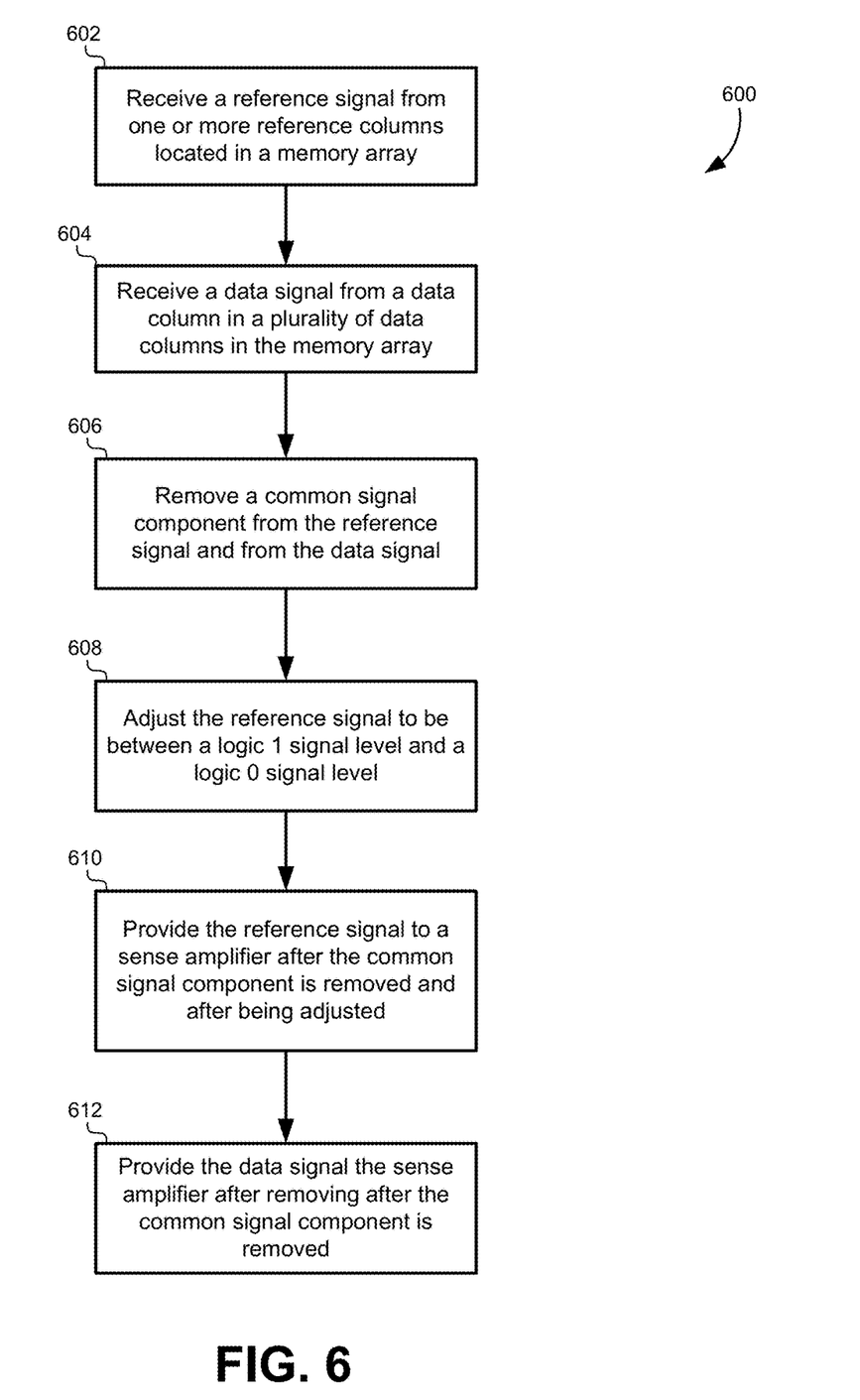
FIG. 6 illustrates a flowchart of a method for reading data from a memory circuit, according to some embodiments.

FIG. 6 illustrates a flowchart of a method for reading data from a memory circuit, according to some embodiments. The method may include receiving a reference signal from one or more reference columns located in a memory array (602). The memory array may include MRAM cells or any other type of resistive memory cells. The one or more reference columns may be located throughout the memory array, including at an approximate center of the memory array or interspersed within the memory array at regular intervals. A subset of the one or more reference columns may be selected for the read operation based on proximity to a corresponding data column. For example, each data column may be assigned to a specific reference column that is in the same sector of the memory array. Some embodiments may also select regular data columns that can be used as reference columns when those data columns are not being actively read.

In some embodiments, a plurality of the one or more reference columns may be used to generate the reference signal. For example, output currents from the plurality of reference columns may be averaged or otherwise combined together to generate the final reference signal. The memory array may also include redundant reference columns that can be used as a backup to primary reference columns in case the primary reference columns fail. The redundant reference column outputs may also be averaged with the primary reference column output to generate the reference signal. The value stored in the one or more reference columns may either be programmable or hard-coded into the reference column. Some embodiments may use a logic level 0 in each of the bit cells in the reference column.

The method may also include receiving a data signal from a data column in a plurality of data columns in the memory array (604). Each of the data columns may include a number of bit cells, each of which stores a representation of a logic 0 or a logic 1. For example, each bit cell may set a polarity of a free-state magnet to store a representation of a logic value. The particular data column may be selected by a read operation using a bit line of the memory array. When selected for the read operation, the data column may provide a data signal. In some embodiments, both the data signal and the reference signal may include an electrical current and/or an electrical voltage value. For example, a current may be provided from the data column to a sense amplifier for comparison to a reference current. Note that although step 602 and step 604 are shown sequentially in flowchart 600, these steps will usually be executed in parallel. Specifically, the reference signal and the data signal may be sent from the memory array and received by the sense amplifier at the same time, thereby eliminating any timing differences associated with the different signals.

The method may additionally include removing a common signal component from the reference signal and from the data signal (606). The common signal component may be a common current component which may be removed from a reference current and from a data current. The common signal component may be removed using a first circuit comprising a pair cascoding transistors for the reference current and a pair of cascoding transistors for the data current. The pairs of cascoding transistors can be matched such that they remove the same common signal from both the reference signal and the data signal. Each pair of cascoding transistors may include series-connected NMOS and PMOS transistors. An example of a first circuit for removing the common signal component is illustrated above in FIG. 3.

The method may further include adjusting the reference signal to be between a logic 1 signal level and a logic 0 signal level (608). For example, the reference signal may be reduced from a high signal level received from a logic 0 output from the reference column. The reference signal may be reduced to an approximate midpoint or centered between the logic 1 signal level and the logic 0 signal level. As with the first circuit for removing the common signal component, a second circuit may include a cascoding pair of series-connected NMOS and PMOS transistors for the reference signal. Corresponding transistors may also be included for the data signal, however, these transistors need not be powered, but may instead be included such that the circuits for the data signal and the reference signal both match. An example of a second circuit for adjusting the reference signal is illustrated above in FIG. 3. Note that although step 606 and step 608 are shown sequentially in flowchart 600, these steps may also be executed in parallel. Specifically, the common signal component can be removed and the reference signal can be adjusted in parallel using the cascoding transistor branches at the same time as illustrated in FIG. 3.

The method may also include providing the reference signal to a sense amplifier (610). The reference signal may be provided to the sense amplifier after the common signal component is removed and after being adjusted to be between the logic 1 signal level and the logic 0 signal level. For example, when the reference signal includes a reference current, the reference current can be reduced by injecting an opposing current into the reference current to reduce the reference signal level. When the reference column outputs a logic 0 signal level, the reduced from the high logic 0 level to be between the logic 0 level and the logic 1 level.

The method may additionally include providing the data signal to the sense amplifier (612). The data signal may be provided to the sense amplifier after removing the common signal component as described above. The sense amplifier may be configured to detect differences between logic 1 and logic 0 signals received from a memory array through the data signal. These differences may be detected by comparing the reference signal to the data signal. The sense amplifier may include any configuration of sense amplifier, including the latching sense amplifier illustrated in FIG. 1C. Note that although step 610 and step 612 are shown sequentially in flowchart 600, these steps will usually be executed in parallel. Specifically, the reference signal and the data signal may be received by the sense amplifier at the same time. Because both signals are activated by the same write line, they will typically propagate through the circuit of FIG. 3 and arrive at the sense amplifier at the same time.

It should be appreciated that the specific steps illustrated in FIG. 6 provide particular methods of reading data from a memory circuit according to various embodiments. Other sequences of steps may also be performed according to alternative embodiments. For example, alternative embodiments may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the example embodiments will provide those skilled in the art with an enabling description for implementing an example embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, aspects various embodiments are described with reference to specific embodiments, but those skilled in the art will recognize that the invention is not limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A memory system comprising:
    a memory array comprising:
        a plurality of data columns that are configured to store data and provide a data signal in response to a read operation;
        a first plurality of reference columns in the memory array configured to provide same logic 0 reference signals, wherein the first plurality of reference columns are distributed throughout the memory array among the plurality of data columns; and
        a second plurality of reference columns in the memory array configured to provide same logic 1 reference signals, wherein the second plurality of reference columns are distributed throughout the memory array among the plurality of data columns;
    a column multiplexer configured to:
        select a first reference column in the first plurality of reference columns that is closest to a data column in the plurality of data columns from which the data signal is being read; and
        select a second reference column in the second plurality of reference columns that is closest to the data column; and
    a circuit configured to combine at least the logic 0 reference signal from the first reference column and the logic 1 reference signal from the second referenc column to generate a reference signal for a sense amplifier to identify the data signal provided from the plurality of data columns.

2. The memory system of claim 1, wherein the memory array comprises a Magnetic Random Access Memory (MRAM) array.

3. The memory system of claim 1, wherein the column multiplexer is further configured to select the first reference column and the second reference columns such that a resistance and capacitance (RC) pathway of the data signal and the reference signal are approximately the same.

4. The memory system of claim 1, wherein the memory array further comprises one or more programmable reference columns that are configured to be programmed to provide logic 0 reference signals or logic 1 reference signals.

5. The memory system of claim 4, wherein the one or more programmable reference columns are programmed and used by the circuit to adjust the reference signal up or down to compensate for process variations.

6. The memory system of claim 1, wherein the memory array further comprises one or more redundant reference columns that are configured to provide logic 0 reference signals or logic 1 reference signals as backup reference columns for the first reference column and the second reference column.

7. The memory system of claim 1, further comprising one or more circuits that receive the data signal and the reference signal in response to the read operation, and use the reference signal to determine whether the data signal represents a logic 1 or a logic 0.

8. The memory system of claim 7, wherein the one or more circuits comprise a first circuit that removes a common signal component from the reference signal and from the data signal by injecting same currents from identical current sources into the data signal and the reference signal.

9. The memory system of claim 7, wherein the one or more circuits comprise a sense amplifier that determines whether the data signal represents a logic 1 or a logic 0 using:
the reference signal after a common signal component is removed; and
the data signal after having the common signal component removed.

10. A method of reading data from a memory system, the method comprising:
receiving, by a memory array, a read signal;
generating, by the memory array, a data signal from a data column in a plurality of data columns in the memory array, wherein the data signal is provided by the data column when selected by the read signal;
generating, by the memory array, a plurality of same logic 0 reference signals from a first plurality of reference columns that are distributed throughout the memory array among the plurality of data columns in the memory array;
generating, by the memory array, a plurality of same logic 1 reference signals from a second plurality of reference columns that are distributed throughout the memory array among the plurality of data columns in the memory array;
selecting, by the memory array, a first reference column in the first plurality of reference columns that is closest to the data column;
selecting, by the memory array, a second reference column in the second plurality of reference columns that is closest to the data column; and
combining at least the logic 0 reference signal from the first reference column and the logic 1 reference signal from the second reference column to generate a reference signal for a sense amplifier to identify the data signal.

11. The method of claim 10, wherein:
the read signal causes the first reference column to output the logic 0 reference signal; and
the read signal causes the second reference column to output the logic 1 reference signal.

12. The method of claim 11, wherein the first reference column and the second reference column are further selected such that:
a resistance and capacitance (RC) pathway of the logic 0 reference signal is the same as an RC pathway of the data signal; and
an RC pathway of the logic 1 reference signal is the same as the RC pathway of the data signal.

13. The method of claim 10, wherein:
the plurality of same logic 0 reference signals and the plurality of same logic 1 reference signals are combined to generate the reference signal without waiting for the logic 0 reference signal and the logic 1 reference signal to stabilize.

14. The method of claim 10, further comprising:
receiving, by a memory array, a write signal for a cell in one of the plurality of data columns;
refreshing, in response to the write signal, a logic 0 level for a corresponding reference cell in the first reference column; and
refreshing, in response to the write signal, a logic 1 level for a corresponding reference cell in the second reference column.

15. The method of claim 10, further comprising:
determining that the first reference column is malfunctioning; and
activating a redundant reference column to replace the first reference column.

16. The method of claim 10, further comprising using the reference signal to determine whether the data signal represents a logic 1 or a logic 0.

17. The method of claim 16, further comprising removing a common signal component from the reference signal and from the data signal by injecting same currents from identical current sources into the data signal and the reference signal.

18. The method of claim 17, further comprising using a sense amplifier to determine whether the data signal represents a logic 1 or a logic 0 using:
the reference signal after a common signal component is removed; and
the data signal after having the common signal component removed.

* * * * *